(12) United States Patent
Tyan et al.

(10) Patent No.: US 7,911,133 B2
(45) Date of Patent: Mar. 22, 2011

(54) ELECTROLUMINESCENT DEVICE HAVING IMPROVED LIGHT OUTPUT

(75) Inventors: Yuan-Sheng Tyan, Webster, NY (US); Donald R. Preuss, Rochester, NY (US); Giuseppe Farruggia, Webster, NY (US); Raymond A. Kesel, Avon, NY (US); Thomas R. Cushman, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 300 days.

(21) Appl. No.: 11/746,820

(22) Filed: May 10, 2007

(65) Prior Publication Data

US 2008/0278067 A1    Nov. 13, 2008

(51) Int. Cl.
*H01J 1/62* (2006.01)
*H01J 63/04* (2006.01)

(52) U.S. Cl. ......... 313/506; 313/483; 313/504; 313/505

(58) Field of Classification Search .......... None
See application file for complete search history.

(56) References Cited

U.S. PATENT DOCUMENTS

| | | | |
|---|---|---|---|
| 3,180,730 A | 4/1965 | Klupfel et al. |
| 3,567,450 A | 3/1971 | Brantly et al. |
| 3,658,520 A | 4/1972 | Brantly et al. |
| 4,356,429 A | 10/1982 | Tang |
| 4,539,507 A | 9/1985 | VanSlyke et al. |
| 4,720,432 A | 1/1988 | VanSlyke et al. |
| 4,768,292 A | 9/1988 | Manzei |
| 4,769,292 A | 9/1988 | Tang et al. |
| 5,061,569 A | 10/1991 | VanSlyke et al. |
| 5,121,029 A | 6/1992 | Hosokawa et al. |
| 5,141,671 A | 8/1992 | Bryan et al. |
| 5,150,006 A | 9/1992 | VanSlyke et al. |
| 5,151,629 A | 9/1992 | VanSlyke |
| 5,283,182 A | 2/1994 | Powell et al. |
| 5,405,709 A | 4/1995 | Littman et al. |
| 5,484,922 A | 1/1996 | Moore et al. |
| 5,503,910 A | 4/1996 | Matsuura et al. |
| 5,593,788 A | 1/1997 | Shi et al. |
| 5,645,948 A | 7/1997 | Shi et al. |
| 5,677,572 A | 10/1997 | Hung et al. |
| 5,683,823 A | 11/1997 | Shi et al. |

(Continued)

FOREIGN PATENT DOCUMENTS

EP    0 891 121    1/1999

(Continued)

*Primary Examiner* — Peter J Macchiarolo
*Assistant Examiner* — Natalie K Walford
(74) *Attorney, Agent, or Firm* — McKenna Long & Aldridge LLP

(57) ABSTRACT

An OLED device including a transparent substrate having a first surface and a second surface, a transparent electrode layer disposed over the first surface of the substrate, a short reduction layer disposed over the transparent electrode layer, an organic light-emitting element disposed over the short reduction layer and including at least one light-emitting layer and a charge injection layer disposed over the light emitting layer, a reflective electrode layer disposed over the charge injection layer and a light extraction enhancement structure disposed over the first or second surface of the substrate; wherein the short reduction layer is a transparent film having a through-thickness resistivity of $10^{-9}$ to $10^{2}$ ohm-cm$^2$; wherein the reflective electrode layer includes Ag or Ag alloy containing more than 80% of Ag; and the total device size is larger than 10 times the substrate thickness.

15 Claims, 4 Drawing Sheets

U.S. PATENT DOCUMENTS

| | | |
|---|---|---|
| 5,703,436 A | 12/1997 | Forrest et al. |
| 5,755,999 A | 5/1998 | Shi et al. |
| 5,834,893 A | 11/1998 | Bulovic et al. |
| 5,928,802 A | 7/1999 | Shi et al. |
| 5,935,720 A | 8/1999 | Chen et al. |
| 5,935,721 A | 8/1999 | Shi et al. |
| 5,955,837 A | 9/1999 | Horikx et al. |
| 6,020,078 A | 2/2000 | Chen et al. |
| 6,091,195 A | 7/2000 | Forrest et al. |
| 6,208,075 B1 | 3/2001 | Hung et al. |
| 6,274,980 B1 | 8/2001 | Burrows et al. |
| 6,694,296 B1 | 2/2004 | Alleva et al. |
| 6,717,358 B1 | 4/2004 | Liao et al. |
| 6,777,871 B2 | 8/2004 | Duggal et al. |
| 6,787,796 B2 | 9/2004 | Do et al. |
| 6,872,472 B2 | 3/2005 | Liao et al. |
| 6,903,505 B2 * | 6/2005 | McNulty et al. ............. 313/504 |
| 6,936,961 B2 | 8/2005 | Liao et al. |
| 6,965,197 B2 | 11/2005 | Tyan et al. |
| 6,991,859 B2 | 1/2006 | Klubek et al. |
| 7,034,470 B2 | 4/2006 | Cok et al. |
| 7,126,267 B2 | 10/2006 | Liao et al. |
| 7,183,707 B2 | 2/2007 | Tyan et al. |
| 7,804,245 B2 * | 9/2010 | Preuss ........................ 313/506 |
| 2001/0026124 A1 | 10/2001 | Liu et al. |
| 2002/0025419 A1 | 2/2002 | Lee et al. |
| 2003/0127973 A1 | 7/2003 | Weaver et al. |
| 2003/0170491 A1 | 9/2003 | Liao et al. |
| 2004/0217702 A1 | 11/2004 | Garner et al. |
| 2005/0018431 A1 | 1/2005 | Shiang |
| 2005/0029933 A1 | 2/2005 | Liao et al. |
| 2005/0225234 A1 | 10/2005 | Tyan et al. |
| 2006/0040132 A1 | 2/2006 | Liao et al. |
| 2006/0087225 A1 | 4/2006 | Liao et al. |
| 2006/0186802 A1 | 8/2006 | Cok et al. |

FOREIGN PATENT DOCUMENTS

| | | |
|---|---|---|
| EP | 1 029 909 | 8/2000 |
| EP | 1 182 244 | 2/2002 |
| EP | 1 187 235 | 3/2002 |
| EP | 1 396 676 | 3/2004 |
| EP | 1 406 474 | 4/2004 |
| EP | 1 734 792 | 12/2006 |
| WO | WO 98/55561 | 12/1998 |
| WO | WO 00/18851 | 4/2000 |
| WO | WO 00/57676 | 9/2000 |
| WO | WO 00/70655 | 11/2000 |
| WO | 02/37568 | 5/2002 |
| WO | 02/37580 | 5/2002 |
| WO | WO 02/37568 | 5/2002 |
| WO | WO 02/37580 | 5/2002 |
| WO | WO 2005094130 A1 * | 10/2005 |
| WO | 2006/040704 | 4/2006 |

* cited by examiner

ELECTROLUMINESCENT DEVICE HAVING IMPROVED LIGHT OUTPUT

This invention was made with government support under the DOE Cooperative Agreement No. DE-FC26-06NT42933 awarded by the Department of Energy. The government has certain rights to the invention.

CROSS REFERENCE TO RELATED APPLICATIONS

Reference is made to commonly assigned U.S. patent application Ser. No. 11/381,757 filed May 5, 2006, by Yuan-Sheng Tyan et al, entitled "Thin-film Electroluminescent Device Having Improved Light. Output" and U.S. patent application Ser. No. 11/102,358, filed Apr. 8, 2005, by Yuan-Sheng Tyan et al, entitled "Performance Enhancement Layer For OLED Devices" the disclosures of which are incorporated herein by reference.

FIELD OF THE INVENTION

The present invention relates to electroluminescent devices, and more particularly, to planar electroluminescent device structures for improving light output.

BACKGROUND OF THE INVENTION

The present invention relates to electroluminescent devices. Examples of electroluminescent devices include small molecule organic light emitting devices (SMOLED), polymer light emitting devices (PLED), and inorganic electroluminescent devices. The term "organic light emitting devices (OLED) refers to both small molecule organic light emitting devices and polymer light emitting devices.

A typical prior art electroluminescent device includes a transparent substrate (which is 1-4 orders of magnitude thicker than the remaining layers), a transparent first electrode layer, a light-emitting element including at least one light-emitting layer, and a reflective second electrode layer. Light is generated in the electroluminescent device when electrons and holes that are injected from the two electrodes flowing through the light-emitting element and generating light by either recombination or impact ionization. The light-emitting element can include several layers of materials including at least a light-emitting layer where the emitted light is generated. In the case of an OLED device, for example, the light-emitting element can include an electron injection layer, an electron transport layer, one or more light-emitting layers, a hole transport layer, and a hole injection layer. One or several of these layers can be combined and additional layers such as electron or hole blocking layers can be added. Most frequently, the first electrode layer is the anode and the second electrode layer is the cathode.

The light-emitting material has an index of refraction larger than that of the air. Most frequently the transparent substrate, located between the light emitting layer and air, has an index of refraction smaller than that of the light-emitting layer but larger than that of air. As the light travels from a higher index layer into the lower index substrate, total internal reflection can take place. The totally internal reflected light cannot transmit into the lower index substrate and is trapped in the higher index layer. In the case of an OLED device, for example, the light emitting layer typically has an index of refraction of 1.7 to 1.8; the transparent electrode layer has an index of about 1.9, and the substrate has an index of about 1.5. Total internal reflection can take place at the transparent electrode/substrate interface. The fraction of the light from the light-emitting layer arriving at this interface with larger than critical angle from the normal is trapped within the organic layers and the transparent electrode layer and is eventually absorbed by the materials in these layers serving no useful functions. This fraction of light has been referred to as the organic-mode of light. Similarly, total internal reflection can take place at the substrate/air interface. The fraction of light arriving at this interface with larger than critical angle from the normal is trapped within the substrate, the transparent electrode layer, and the organic layers and is eventually absorbed by the materials in the device or exited at the edges of the OLED device serving no useful function. This fraction of light has been referred to as the substrate-mode of light. It has been estimated that more than 50% of light generated by the light-emitting layer ends up as the organic mode of light, more than 30% ends up as the substrate mode of light, and less than 20% of light from the light-emitting layer is outputted into the air and becomes useful light. The 20% of generated light that actually emits from the device has been referred to as the air-mode of light. Light trapping due to total internal reflection thus decreases drastically the output efficiency of electroluminescent devices.

Various techniques have been suggested to increase the efficiency of the thin-film electroluminescent devices by reducing the light trapping effect and allow the substrate-mode and organic-mode of light to emit from the device. These techniques are described in the references in detail and are included here by reference: U.S. Pat. Nos. 5,955,837, 5,834,893; 6,091,195; 6,787,796, 6,777,871; U.S. Patent Application Publication Nos. 2004/0217702 A1, 2005/0018431 A1, 2001/0026124 A1; WO 02/37580 A1, WO 02/37568 A1. While many of these techniques have shown increase in the extraction of light efficiently remains a problem.

SUMMARY OF THE INVENTION

The present invention provides electroluminescent devices with improved light extraction efficiency and improved operating lifetime.

Light trapping takes place in OLED devices because some of the light rays generated by the light-emitting layer are incident on the organic-substrate interface or the substrate-air interface, hereto referred to as "interfaces", at a larger than critical angle and is reflected back into the device by total internal reflection (TIR). The TIR light then travels in the OLED structure and may be reflected by the reflective electrode and incident on these interfaces again many times before it is fully absorbed by the various layers in the OLED structure or escaped through the edges of the OLED device. Because of the planer geometry of the OLED structure, the reflected light never changes its angle of incidence toward these interfaces at later encounters and always suffers TIR. The TIR light is therefore trapped in the OLED structure. To permit this light to be extracted into the air, its incidence angle at these interfaces has to be changed. Techniques proposed in the prior art for light extraction efficiency enhancement provide an enhancement structure that can change the direction of light such that the trapped light has an increased chance of escaping into the air. Since the light-emitting layer emits some light in all directions, the light generated by the light-emitting layer arrives at the interfaces at all angles. None of the proposed techniques can redirect all the light rays to a smaller than critical angle to permit it to escape completely into the air. Instead, they change only a fraction of the light rays into preferred (sub-critical) directions each time they strike the enhancement structure. For example, techniques that use micro-lenses or photonic crystal structures can redirect light rays that strike them within a certain angle range to escape into the air; techniques that utilize scattering centers will redirect randomly or semi-randomly a fraction of any light that strikes it into the air. In all cases it takes many passes for all of the generated light to escape. While traveling within the OLED structure, light can suffer absorption losses. The fact that it takes several passes before all the light can escape into the air exaggerates the problem. It has been discovered that the reflective electrode can be a major contributor to the absorption problem. Even though it is widely recognized that it is desirable to have a high reflective metal as the reflective electrode, it has been discovered that even aluminum, the most commonly used reflective electrode for OLEDs because of its high reflectivity, significantly reduces the extraction efficiency when light extraction enhancement features are used. It has also been discovered that Ag or a Ag-based alloy gives much better results when used as the reflective electrode for OLEDs with extraction enhancement structures. For conventional OLEDs without the extraction enhancement features, the performance difference between those using Al electrodes and those using Ag or a Ag-based alloy electrode is negligibly small. The superior performance of Ag or a Ag-based alloy only becomes significant when light extraction enhancement structures are used. U.S. Pat. No. 6,965,197 suggested the use of Ag or a Ag based alloy as the reflective electrode. In practice Ag or a Ag based alloy is seldom used as the reflective electrode for OLEDs, however, because there are problems associated with the use of Ag or a Ag-based alloy electrode. First of all, Ag has a work function value that is too low to work well as an anode and too high as a cathode. Secondly, it has been found empirically that OLED devices using Ag or a Ag based alloy as the reflective electrode are prone to fail prematurely during operation because of shorting. Thirdly, when Ag or a Ag based alloy is used as the reflective electrode, it has been discovered that, due to reduced absorption by the electrode, the emitted light on the average travels farther laterally in the device before it is extracted. If the total device size is not significantly larger than the thickness of the substrate, some light spreads to outside the device area and is lost to absorption by structures outside the device area, to emission out the opposite side of the device, or to emission from the edges of the substrate. The magnitude of this spreading loss can be appreciable.

The OLED device can be a pixilated device, such as an active matrix or a passive matrix display, having the active area divided into many small light emitting pixels, and may include non-emitting regions separating the pixels. The total device region would be the region containing essentially all pixels and the non-emitting regions separating the pixels. The OLED device can also be comprised of many segments, such as those in a serially connected array as taught in U.S. Pat. Nos. 6,694,296, and 7,034,470. The total device region would be the region containing essentially all segments.

As used herein, the total device size is the smallest linear dimension of the total device region.

The present invention solves the work function matching problem by using an efficiency charge injection layer as part of the light-emitting element. This charge injection layer is disposed adjacent to the Ag or Ag based alloy reflective electrode. An electron injection layer is selected if the reflective electrode is used as the cathode and a hole injection layer is selected if the reflective electrode is the anode. Appropriate electron or hole injecting layers will be described in detail later. The present invention solves the premature shorting failure problem by disposing a thin-transparent layer of appropriate electrical resistivity between the two electrodes. The thin-transparent layer with the appropriate electrical resistivity is herein referred to as a short-reduction layer. The present invention also solves the spreading loss problem by using a device structure that has the total device size at least a factor of 10 larger than the thickness of the substrate.

In an exemplary embodiment according to the present invention, an OLED device includes:
a. a transparent substrate having a first surface and a second surface;
b. a transparent first electrode layer disposed over the first surface of the substrate;
c. a short reduction layer disposed over the transparent first electrode layer;
d. an organic light-emitting element disposed over the short reduction layer and including at least one light-emitting layer and a charge injection layer disposed over the light emitting layer;
e. a reflective electrode layer disposed over the charge injection layer; and
f. a light extraction enhancement structure disposed over the first or second surface of the substrate;

wherein the short reduction layer is a transparent thin-film having a through-thickness resistivity of $10^{-9}$ to $10^2$ ohm-$cm^2$; wherein the reflective electrode layer includes Ag or Ag alloy containing more than 80% of Ag; and the total device size is larger than 10 times the substrate thickness.

DETAILED DESCRIPTION OF THE INVENTION

The present invention is described below with respect to OLED devices. It should be understood, however, that the same or similar can also be applied to inorganic electroluminescent devices.

U.S. Patent Application Publication No. 2005/2225234 teaches the use of a thin resistive film to reduce the detrimental effect due to shorting defects predisposed in OLED devices prior to their operation. The object is to increase manufacturing yield. The subject matter dealt with in the present invention is OLED devices using Ag or a Ag based alloy that have no shorting defects prior to their operation. These devices, however, are prone to developing shorting defects during their actual operation. The electrical currents passing through the OLED devices apparently induce these defects but the mechanism for these induced shorting defects is not known. One speculation is that the high electrical field between the two electrodes or the operating electrical current causes the migration of Ag atoms forming conductive filaments that penetrate through the many layers in the OLED structure and connect the two electrodes. If this were indeed the mechanism the Ag filaments may penetrate through the short reduction layer as well. Quite unexpectedly, such penetration does not take place when proper materials are selected in accordance with this invention as the short reduction layer and a dramatic decrease of the occurrence of operation induced shorting failures was observed.

Figure 1:
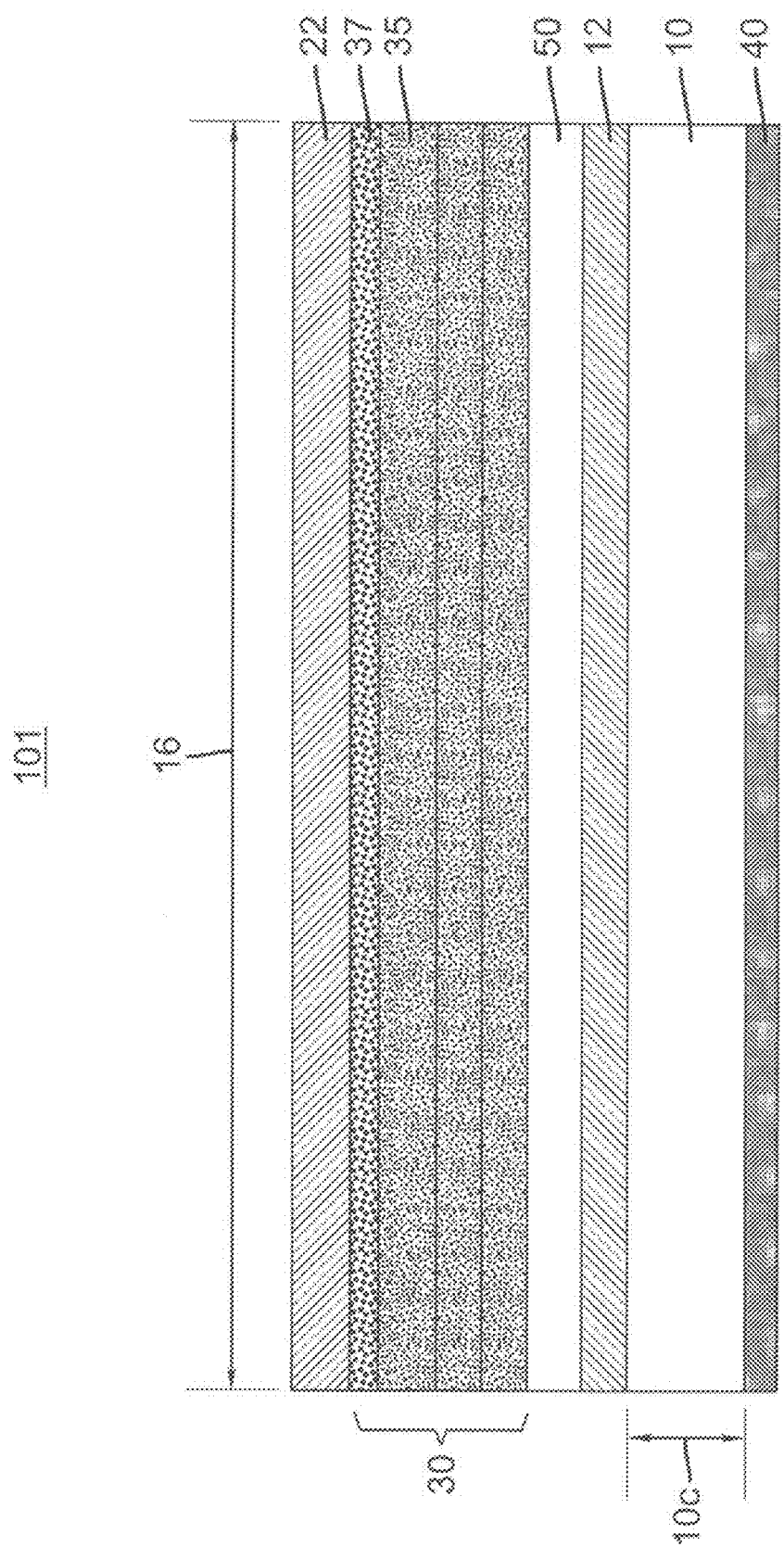
FIG. 1 is a schematic cross section of an OLED device in accordance with the present invention.

Referring to FIG. 1 there is shown an OLED device 101 in accordance with one embodiment of the present invention. OLED device 101 having a device size 16, includes a substrate 10 having a first surface 10a and a second surface 10b and a substrate thickness 10c. Disposed over first surface 10a of substrate 10 are a transparent electrode layer 12, a short reduction layer 50, an organic light-emitting element 30, and a reflective electrode layer 22. Disposed over second surface 10b of substrate 10 is a light extraction enhancement structure 40. In addition, there may be other layers over either first surface 10a or second surface 10b including, for example, protective layers disposed over reflective second electrode layer 22 and/or light extraction enhancement structure 40.

Organic light-emitting element 30 includes at least a light-emitting layer 35 and a charge injection layer 37. It can have other layers including a second charge injection layer, an electron transport layer, more light-emitting layers, and a hole transport layers. Organic light-emitting element 30 can also have a stack structure having more than one light-emitting layer separate by connectors. The construction of stacked structures are described in detail in U.S. Pat. Nos. 6,872,472; 6,936,961; 6,717,358; 6,991,859; 7,126,267; and U.S. Patent Application Publication Nos. 2005/0029933 A1; 2006/0040132 A1; 2006/0087225 A1 and are incorporated herein by reference. Charge injection layer 37 is disposed adjacent to reflective electrode 22 and is selected to be an electron injection layer if reflective electrode 22 is the cathode and to be a hole injection layer if reflective electrode layer 22 is the anode. In operation a voltage is applied between transparent electrode layer 12 and reflective electrode layer 22 causing electrical carriers to be injected into light-emitting layer 35. As these carriers combine, light is generated in light-emitting layer 35. OLED device 101 is commonly referred to as a bottom-emitting device wherein light generated from light-emitting layer 35 is transmitted through short reduction layer 50, transparent electrode layer 12, and transparent substrate 10 into the air.

Transparent electrode layer 12 is typically formed of a transparent conductive metal oxide layer such as Indium-Tin Oxide (ITO), Indium-Zinc Oxide (IZO), Aluminum-doped Zinc Oxide (AZO), et al. Alternatively, transparent electrode layer 12 can be formed of a thin metal film or the combination of a thin metal film with one or more transparent oxide layers including ITO, IZO, or AZO. Preferably, the metal is Ag, Ag based alloys, Mg, Ag—Mg alloy, Au, Al, or Cu. Reflective electrode layer 22 is preferably formed of Ag or Ag based alloys. For the purpose of the present invention, Ag based alloys are alloys containing more than 80 atomic percent of Ag. Reflective electrode layer 22 can also include more than one layer, in this case at least one of the layers, preferably the one closest to the organic light emitting element, includes Ag or Ag based alloys. Reflective electrode layer 22 can be formed by common vacuum deposition techniques such as evaporation and sputtering. The preferred thickness of reflective electrode layer 22 is 30 nm or larger.

Short reduction layer 50 is a thin transparent layer of appropriate electrical resistivity capable of reducing the detrimental effects of shorting defects incurred during the operation of OLED devices. Short reduction layer 50 can be applied over most of the area of first surface 10a of the substrate 10. Alternatively, if the OLED device includes more than one segment, it can also be formed to have the same pattern as the segments and covering essentially only the active area of the OLED device.

The operation induced shorting failure of OLED devices with reflective electrodes of Ag or a Ag based alloy is believed to be caused by the formation of conductive Ag filaments between the two electrodes as a result of the high electrical field or the operating electrical current. Once formed these filaments provide low resistance pathways that divert the applied current from the device causing it to fail. A properly chosen short reduction layer 50 adds a much larger electrical resistance to the Ag filaments than it does to the device itself because the former have much smaller contact surface area than the latter. The applied current now flows preferentially through the device rather than through the Ag filaments thereby mitigating the detrimental effects of the Ag filaments.

The following terms are defined for the purpose of facilitating the discussion of the detailed implementation of the present invention:

(a) Bulk resistivity, p, the fundamental property of a material; the unit is ohm-cm.

(b) Sheet resistivity, p/t, the electrical resistivity of a thin sheet of material with a thickness t; the unit is ohm, or preferably, ohm/square.

(c) Through-thickness resistivity, pt, the electrical resistivity through the thickness of a thin sheet of material with a thickness t; the unit is ohm-cm$^2$.

The effective electrical resistance of an OLED device depends on its size and its operating conditions. In one exemplary embodiment of the present invention, OLED device 101 operates at 1000 cd/m$^2$ and has a luminescence efficiency 20 cd/A and an operating voltage of 3 volts. The effective through-thickness resistivity of OLED device 101 is therefore about 600 ohms-cm$^2$. If size of the OLED device 101 is 10 cm$^2$, the effective electrical resistance of the device is about 60 ohms. To ensure, for example, that less than 10% of the applied current will flow through the shorting defects, the total electrical resistance through the shorting defects has to be larger than 600 ohms. If the total Ag filament contact surface area is 100 nm×100 nm ($10^{-10}$ cm$^2$) a thin-film layer with an through-thickness resistivity of $6\times10^{-8}$ ohm-cm$^2$ or larger will add more than 600 ohms electrical resistance to the shorting defects and be effective as a short reduction layer 50. Thin-films with higher through-thickness resistivity are even more effective in reducing the detrimental effect of shorting defects. There is a limit to the resistivity, however, since the presence of short reduction layer 50 also adds an electrical resistance of to the device. Because the device has an effective through-thickness resistivity of 600 ohm-cm in this example, the short reduction layer has to have a through-thickness resistivity less than 10% of this value, or 60 ohm-cm$^2$, to ensure that the added resistance does not reduce more than 10% of the device performance. For the case under discussion, therefore, thin-films with a through-thickness resistivity between $6\times10^{-8}$ ohm-cm$^2$ and 60 ohm-cm$^2$ can be used as an effective short reduction layer 50. The preferred thickness for short reduction layer 50 is from about 20 nm to about 200 nm. The required bulk resistivity of the materials for the short reduction layer is therefore from about $3\times10^{-2}$ to $3\times10^7$ ohm-cm for the 20 nm thin-film and $3\times10^{-3}$ ohm-cm to $3\times10^6$ ohm-cm for the 200 nm thin-film, respectively. The corresponding sheet resistivity is $1.5\times10^4$ to $1.5\times10^{13}$ ohm/square for the 20 nm thin-film and $1.5\times10^3$ to $1.5\times10^{12}$ ohm/square for the 200 nm thin-film, respectively.

The present invention can be applied to OLED devices having other operating efficiencies under different conditions than the ones described above. For most OLED devices the through thickness electrical resistivity of short reduction layer 50 should be in the range of $6\times10^{-8}$ ohm-cm$^2$ to $10^2$ ohm-cm$^2$ and preferably in the range of $2\times10^{-6}$ ohm-cm$^2$ to 2 ohm-cm². This can be accomplished by using a 20 to 200 nm thick thin-film formed of materials with bulk resistivity of $3 \times 10^{-3}$ ohm-cm to $3 \times 10^{7}$ ohm-cm and preferably in the range of $10^{-1}$ ohm-cm to $10^{6}$ ohm-cm.

Usable materials for short reduction layer 50 include inorganic indium oxide, zinc oxide, tin oxide, molybdenum oxide, vanadium oxide, antimony oxide, bismuth oxide, rhenium oxide, tantalum oxide, tungsten oxide, niobium oxide, nickel oxide, or mixtures thereof. Thin-films of these oxide materials can be prepared by common vacuum deposition techniques such as evaporation and sputtering. It is to be noted that thin-films of some of these oxide materials or mixtures of them have been developed with low electrical resistivity suitable, for example, for applications such as the transparent electrodes for OLEDs or photovoltaic solar cells. For such applications the, the bulk resistivity needs to be less than about $10^{-3}$ ohm-cm, which makes these thin-films incapable of functioning as short reduction layers. By properly controlling deposition conditions including oxygen partial pressure, however, thin-films of these materials can also be prepared with electrical resistivity in the range useful as a short reduction layer. Other materials suitable for use as short reduction layers include mixtures of an oxide material listed above with an insulating material selected from oxides, fluorides, nitrides, sulfides, and mixtures thereof. The resistivity of the mixture layer can be tuned to the desired range by adjusting the ratio of these two kinds of materials. One particular useful material for short reduction layer is a mixture of zinc sulfide or zinc sulfide-silicone oxide mixture with indium-tin oxide, indium oxide, or tin oxide. Layers containing a mixture of materials can be prepared by co-sputtering form two or more targets or by co-evaporation from two or more vapor sources. Alternatively these layers can be prepared by sputtering from a pre-mixed target containing materials in the mixture or by evaporation from a pre-mixed source including the use of flash evaporation or wire-feed evaporation.

Light extraction enhancement structure 40 can be any structure that improves the emission of light from an OLED device. Examples of light extraction enhancement structure 40 are described in the references in detail and are included here by reference: U.S. Pat. Nos. 5,955,837, 5,834,893; 6,091,195; 6,787,796, 6,777,871; U.S. Patent Application Publication Nos. 2004/0217702 A1, 2005/0018431 A1, 2001/0026124 A1; WO 02/37580 A1, WO02/37568 A1. Effective light extraction enhancement structures include scattering layers; surface roughness; photonic crystals; and micro-lens arrays. A scattering layer can be formed of particles or voids dispersed in a matrix having different optical index from the particles or the voids. The scattering layer can be coated on second surface 10b or on a separate support and then laminated to second surface 10b. A scattering layer can also be formed of a coating of high index particles with voids between the particles on second surface 10b. Preferred high index particles are selected from a group of inorganic materials including Titanium Oxide, Zirconium oxide, Niobium Oxide, Tantalum Oxide, Zinc Oxide, Tin Oxide, and Zinc Sulfide. The size of the particle can range from about 100 nm to about 10,000 nm; the shape of the particles can be spherical, ellipsoidal, or irregular. Preferably, the particles are irregular in shape and have a maximum linear extent between 300 nm to about 2,000 nm. Also preferably, the material of the particles is Titanium Oxide. A micro-lens array is a two dimensional, regular or irregular, array of surface features having semispherical or pyramidal shape. The micro-lens array can be formed by directly shaping second surface 10b by embossing or etching, it can also be formed by laminating a sheet of a separate material carrying such surface features onto second surface 10b. The size of the surface features is preferably between about 1,000 nm to about 1,000,000 nm. Surface roughness is random roughing of second surface 10b without any specific size or shape. Photonic crystals are periodic dielectric structures formed on 10b or on a separate sheet of material laminated to 10b.

In an OLED device with a reflective electrode 22 including Ag or a Ag based alloy, light extraction enhancement element 40 cannot extract all the trapped light within the device area and, therefore, unless the total device size 16 is significantly larger than the substrate thickness 10c, a substantial amount of light travels laterally in substrate 10 to outside the device area and is lost. For efficient light extraction the total device size 16 has to be at least ten times and preferably more than 20 times the substrate thickness 10c.

Figure 2:
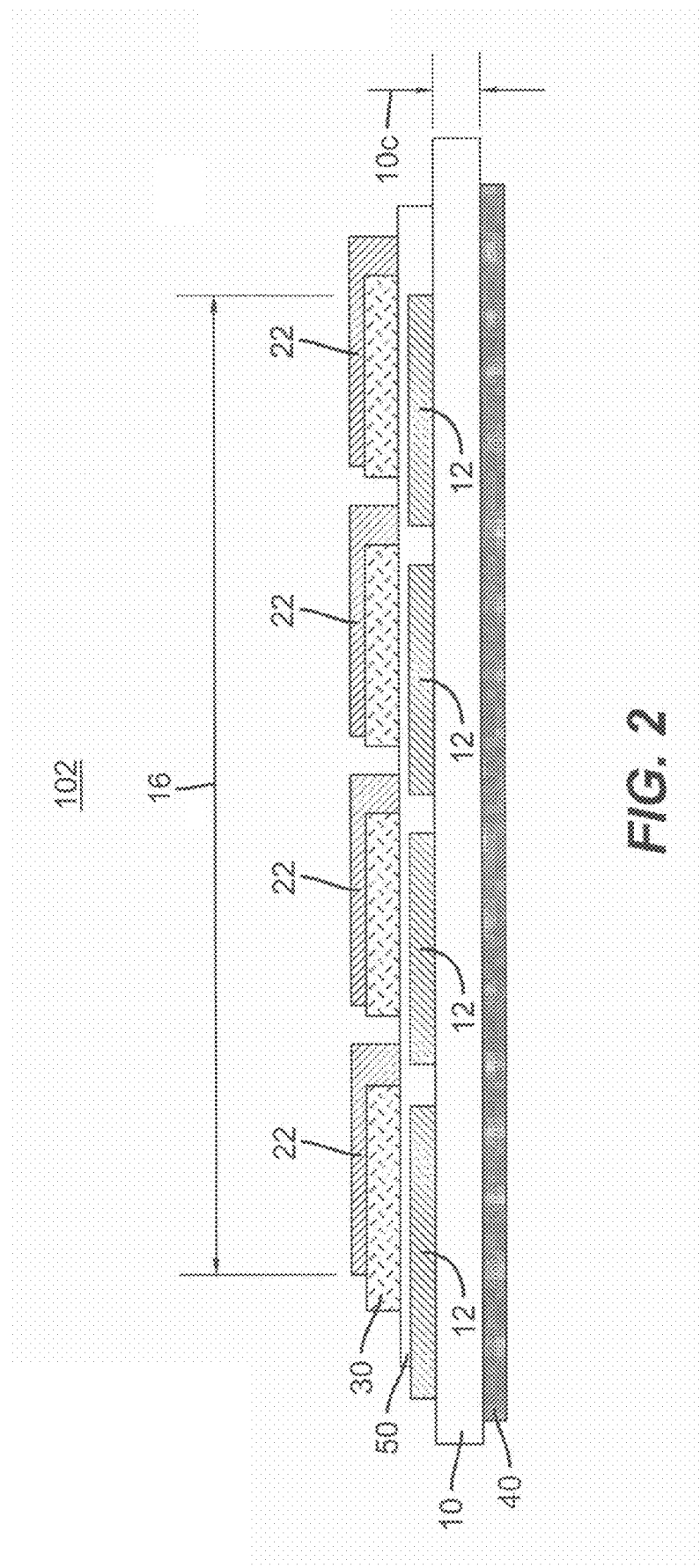
FIG. 2 is a schematic cross section of an OLED device comprising an array of serially connected segments in accordance with the present invention.

Referring to FIG. 2 there is shown schematically the cross sectional view of an OLED device 102 in accordance with one exemplary embodiment of the present invention. OLED device 102 is a serially connected array of four OLED segments on a common substrate 10 wherein the transparent electrode of one segment is connected to the reflective electrode of the next segment to its left. All the OLED segments include all of the layers as in OLED device 101 but for clarity not all the layers are shown in FIG. 2. When a voltage is applied to reflective electrode 22 of first segment on the left and transparent electrode 10 of last segment to the right, a current flows through all the four segments and all of them produce light. Such serially connected arrays have been described in details in U.S. Pat. Nos. 6,694,296, and 7,034,470. Also shown in FIG. 2 are total device size 16 and substrate thickness 10c. The individual segments or pixels can also have a stacked OLED structure, described in U.S. Pat. Nos. 5,703,436 and 6,274,980, in which multiple light-emitting layers are separated by connectors.

Figure 3:
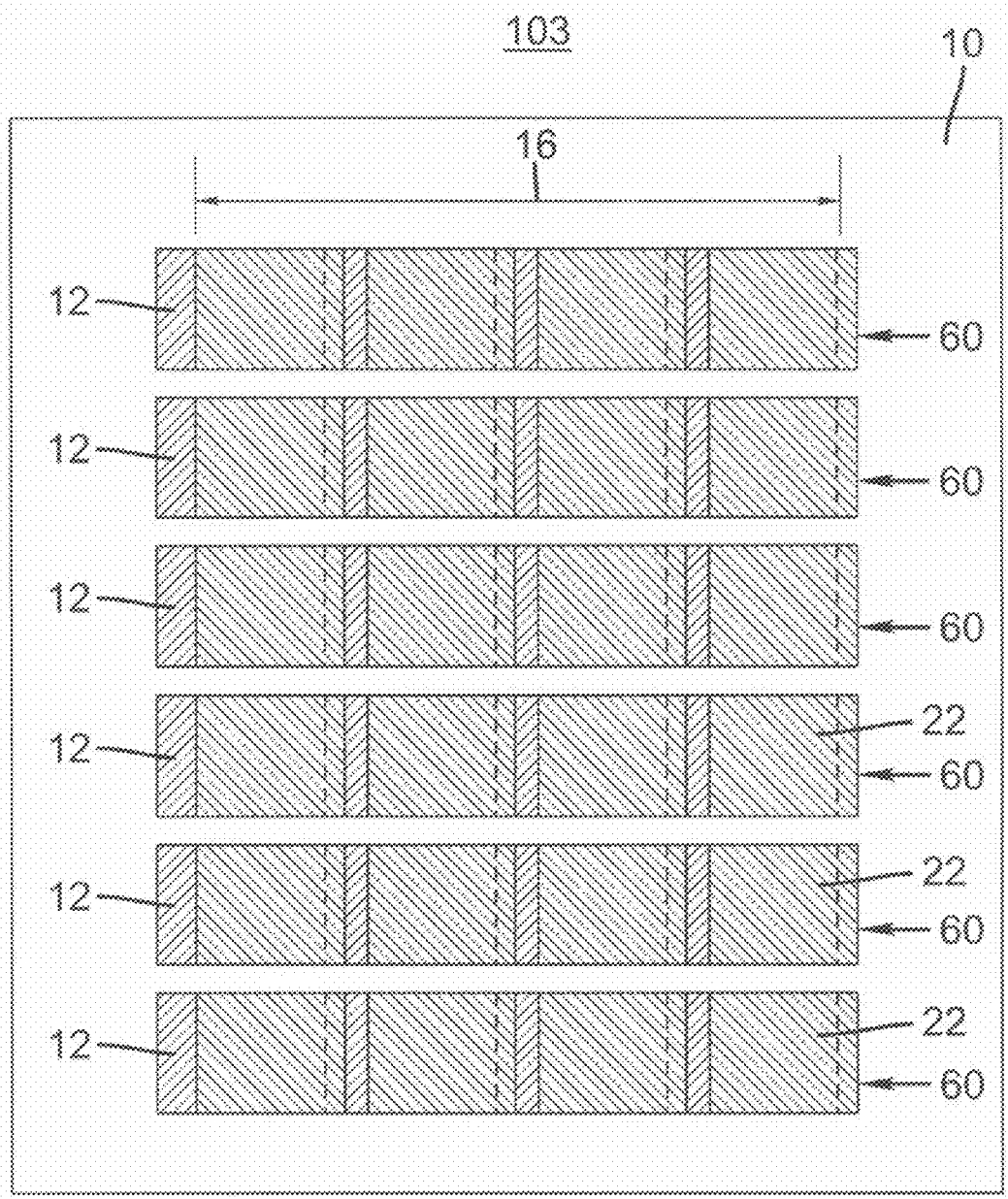
FIG. 3 is a schematic top view of an OLED device comprising several arrays of serially connected segments in accordance with the present invention.

Referring to FIG. 3 there is shown the top view of an OLED device 103 in accordance with one exemplary embodiment of the present invention. OLED device 103 includes six serially connected arrays 60 on a common substrate 10. OLED device 103 includes all the layers as in device 101 but for the clarity of discussion only substrate 10, transparent electrode layer 12, and reflective electrode layer 22 are shown. Also shown in FIG. 3 is total device size 16 and substrate thickness 10c. Again, for devices including multiple segments or pixels, the total device size is the smallest linear dimension of the total active region of the OLED device.

Figure 4:
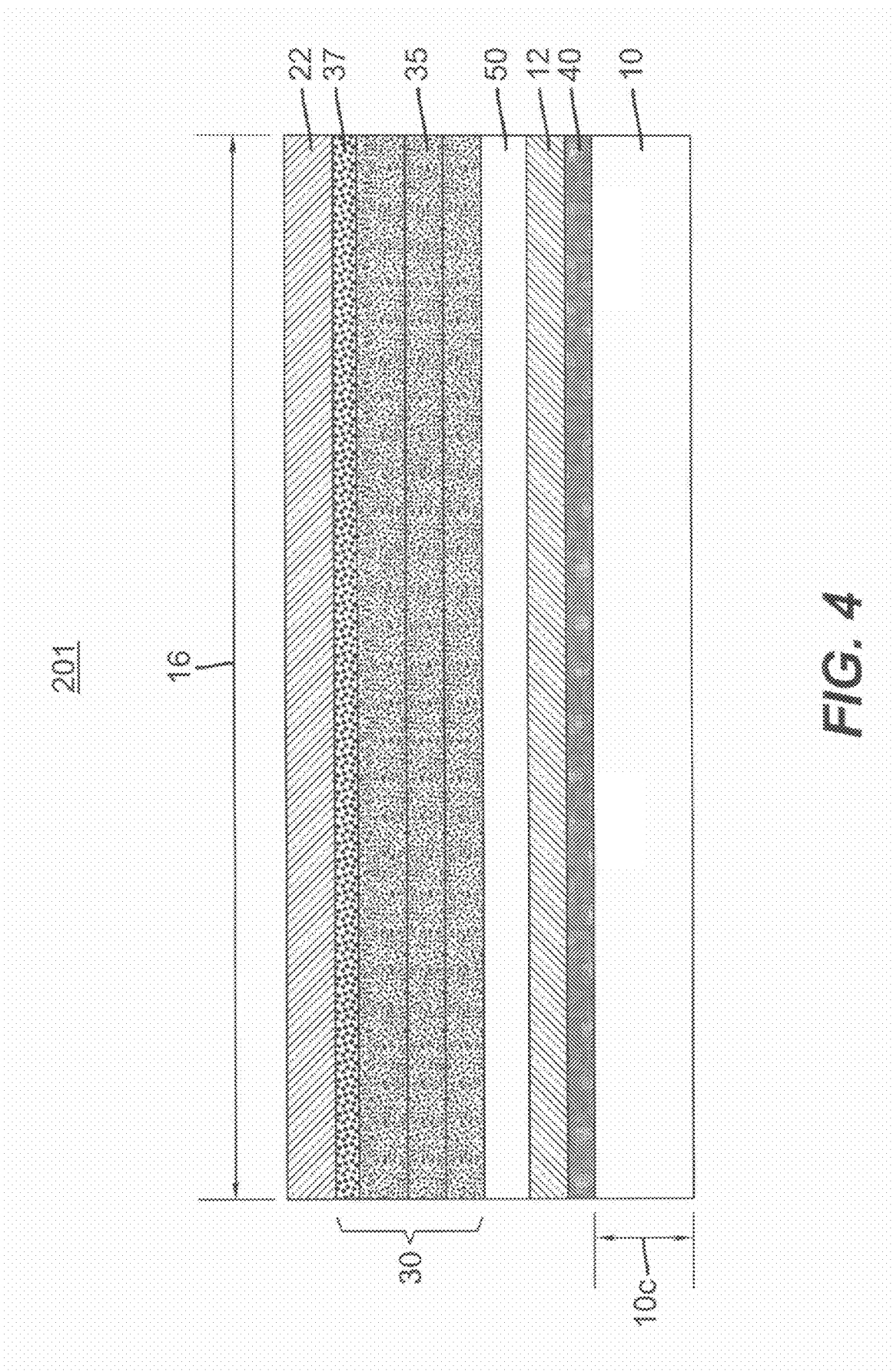
FIG. 4 is a schematic cross section of an OLED device in accordance with the present invention.

Referring to FIG. 4 there is shown a schematic cross section of an OLED device 201. OLED device 201 includes a substrate 10, a light extraction enhancement structure 40, a transparent electrode layer 12, a short reduction layer 50, an organic light-emitting element 30, and a reflective electrode layer 22. All layers share the same description as for OLED device 101 with the exception that layer 40 is now disposed between substrate 10 and transparent electrode layer 12. Consequently light extraction enhancement structure 40 needs to have the additional feature of a smooth surface for the other layers to build over it without shorting out the device. OLED devices 201 can also be pixilated or segmented. OLED devices in accordance with the present invention can be used as display devices or illumination devices. In the former case the OLED devices can be part of a passive matrix structure or an active matrix structure.

Common Device Features

Substrate

The OLED of the present invention is typically provided over a supporting substrate where either the cathode or anode can be in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, metals with insulating surface layers, and circuit board materials. Of course, it is necessary to provide in these device configurations a light-transparent top electrode.

Anode and Cathode

Transparent electrode 12 can be either the anode or the cathode of the OLED device. When transparent electrode 12 is the anode reflective electrode 22 is the cathode and vise versa.

Hole-Injecting Layer (HIL)

While not always necessary, it is often useful to provide a HIL in contact with the anode. In particular, when a reflective electrode layer 22 formed of Ag or a Ag based alloy is used as the anode, a HIL in contact with reflective electrode 22 is essential because Ag or a Ag based alloy does not have the right work function to inject holes effectively. The HIL can serve to facilitate the injection of holes into the HTL reducing the driving voltage of the OLED. It can also, in some cases, improve the film formation property of subsequent organic layers. Suitable materials for use in the HIL include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA(4,4',4"-tris[(3-ethylphenyl)phenylamino]triphenylamine). Alternative hole-injecting materials reportedly useful in organic EL devices are described in EP 0 891 121 A1 and EP 1 029 909 A1.

A p-type doped organic layer is also useful for the HIL as described in U.S. Pat. No. 6,423,429. A p-type doped organic layer means that the layer is electrically conductive, and the charge carriers are primarily holes. The conductivity is provided by the formation of a charge-transfer complex as a result of electron transfer from the host material to the dopant material.

Some inorganic metal oxides are also good HIL materials. Useful inorganic HIL materials include but are not limited to molybdenum oxide, vanadium oxide, nickel oxide, and silver oxide. A very thin layer, from a tenths of a nanometer to a few tens of nanometers in thickness, of these materials can provide the desirable HIL functions.

Hole-Transporting Layer (HTL)

HTL in the OLED contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The HTL can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis [N-(1-naphthyl)-N-phenylamino]biphenyl
4,4'-Bis [N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis [N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the LEL 134 in OLED 200 includes a luminescent or fluorescent material where electroluminescence is produced as a result of hole-electron pair recombination in this region. The LEL can include at least one host material doped with a guest compound or compounds where light emission occurs primarily from the dopant and can be of any color. The host materials in the LEL can be an electron-transporting material, a hole-transporting material, or another material or combination of materials that support hole-electron recombination. The dopant is usually selected from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes, e.g., poly(p-phenylenevinylene), PPV, can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the electron energy band gap. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine[alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-µ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)].

Other classes of useful host materials include, but are not limited to, derivatives of anthracene, such as 2-(1,1-dimethylethyl)-9,10-bis(2-naphthalenyl) anthracene (TBADN), 9,10-di-(2-naphthyl) anthracene (ADN), and derivatives thereof as described in U.S. Pat. No. 5,935,721, distyrylarylene derivatives as described in U.S. Pat. No. 5,121,029, benzazole derivatives, for example, 2,2',2"-(1,3,5-phenylene)tris[1-phenyl-1H-benzimidazole], and blue emitting metal chelated oxinoid compounds, for example, Bis(2-methyl-8-quinolinolato)(4-phenylphenolato)aluminum (B-Alq). Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis (azinyl)methane compounds, and carbostyryl compounds.

In the present invention, the thickness of the LEL is in the range of from 5 nm to 45 nm. Preferably, the thickness of the light-emitting layer is in the range of from 5 nm to 30 nm. More preferably, the thickness of the light-emitting layer is in the range of from 5 nm to 20 nm.

Electron-Transporting Layer (ETL)

Preferred thin film-forming materials for use in forming the ETL in the OLED devices are metal chelated oxinoid compounds, including chelates of oxine itself, also commonly referred to as 8-quinolinol or 8-hydroxyquinoline. Such compounds help to inject and transport electrons, exhibit high levels of performance, and are readily deposited to form thin films. Exemplary oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-µ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]

Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, and some silole derivatives are also useful electron-transporting materials.

Electron-Injecting Layer (EIL)

While not always necessary, it is often useful to provide an EIL in contact with the cathode. In particular, when reflective electrode layer 22 formed of Ag or a Ag based alloy is used as the cathode an EIL in contact with reflective electrode layer 22 is essential because Ag or Ag based alloys do not have the right work function to inject electrons effectively. The EIL can serve to facilitate injection of electrons into the ETL and to increase the electrical conductivity resulting in a low driving voltage of the OLED as described in U.S. Pat. No. 6,013,384. Suitable materials for use in the EIL are the aforementioned ETL with strong reducing agents as dopants or with low work function metals (<3.0 eV) as dopants to form an n-type doped organic layer. An n-type doped organic layer means that the layer is electrically conductive, and the charge carriers are primarily electrons. The conductivity is provided by the formation of a charge-transfer complex as a result of electron transfer from the dopant material to the host material. Alternative inorganic electron-injecting materials can also be useful to form an EIL in the OLED. The inorganic EIL preferably includes a low work-function metal or metal salt, such as a 0.5~1 nm LiF layer as described in U.S. Pat. No. 5,677,572 or a 0.4~10 nm Li or Ca metal layer.

Alternative Layers

In some instances, organic HIL, which can optionally be named as HTL, serves the function of supporting both hole-injection and hole-transport, and organic EIL, which can optionally be named as ETL, serves the function of supporting both electron-injection and electron-transport. It is also known in the art that emitting dopants may be added to an HTL, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in U.S. Patent Application Publication 2002/0025419 A1; U.S. Pat. Nos. 5,683,823; 5,503,910; 5,405,709; 5,283,182; EP 1 187 235; and EP 1 182 244.

Additional layers such as an electron-blocking layer at the anode side and adjacent to the LEL as taught in the art may be employed in devices of the present invention.

The invention has been described in detail with particular reference to certain preferred embodiments thereof, but it will

PARTS LIST

| | |
|---|---|
| 10 | substrate |
| 10a | first surface |
| 10b | second surface |
| 10c | substrate thickness |
| 12 | transparent electrode layer |
| 16 | total device size |
| 22 | reflective electrode layer |
| 30 | light-emitting element |
| 35 | light-emitting layer |
| 37 | charge injection layer |
| 40 | light extraction enhancement structure |
| 50 | short reduction layer |
| 60 | serially connected array |
| 101 | OLED device |
| 102 | OLED device |
| 103 | OLED device |
| 201 | OLED device |

The invention claimed is:

1. An OLED device comprising in sequence:
a transparent substrate having a first surface and a second surface;
a light extraction enhancement structure in direct contact with the first or second surface of the substrate;
a transparent electrode layer either in direct contact with the first surface of the substrate or the light extraction enhancement structure located on the first side of the substrate;
a short reduction layer in direct contact with the transparent electrode layer wherein the short reduction layer is a transparent film having a through-thickness resistivity of $10^{-9}$ to $10^2$ ohm-cm$^2$;
an organic light-emitting element disposed over the short reduction layer and including at least one light-emitting layer and a charge injection layer disposed over the light emitting layer;
a reflective electrode layer disposed over the charge injection layer wherein the reflective electrode layer includes Ag or Ag alloy containing more than 80% of Ag; and
the total device size is larger than 10 times the substrate thickness.

2. The OLED device of claim 1 wherein the short reduction layer includes a material selected from indium oxide, zinc oxide, tin oxide, molybdenum oxide, vanadium oxide, antimony oxide, bismuth oxide, rhenium oxide, tantalum oxide, tungsten oxide, niobium oxide, or nickel oxide.

3. The OLED device of claim 1 wherein the short reduction layer includes a mixture of at least two materials selected from indium oxide, zinc oxide, tin oxide, molybdenum oxide, vanadium oxide, antimony oxide, bismuth oxide, rhenium oxide, tantalum oxide, tungsten oxide, niobium oxide, or nickel oxide.

4. The OLED device of claim 1 wherein the short reduction layer includes a mixture of an electrically insulating oxide, fluoride, nitride, or sulfide material and at least one material selected from indium oxide, zinc oxide, tin oxide, molybdenum oxide, vanadium oxide, antimony oxide, bismuth oxide, rhenium oxide, tantalum oxide, tungsten oxide, niobium oxide, or nickel oxide.

5. The OLED device of claim 4 wherein the short reduction layer includes a mixture of zinc sulfide with indium-tin oxide, indium oxide, or tin oxide.

6. The OLED device of claim 1 wherein the reflective electrode is a cathode and the charge injection layer is an electron injection layer.

7. The OLED device of claim 1 wherein the reflective electrode is an anode and the charge injection layer is a hole injection layer.

8. The OLED device of claim 1 wherein the light extraction enhancement structure is a scattering layer.

9. The OLED device of claim 8 wherein the scattering layer includes particles or voids dispersed in a matrix having different optical index from the particles or the voids.

10. The OLED device of claim 8 wherein the scattering layer is on a separate support and then laminated to the substrate.

11. The OLED device of claim 8 where in the scattering layer includes a coating of high index particles with voids between the particles on the substrate surface.

12. The OLED device of claim 11 wherein the high index particles are selected from inorganic materials including Titanium Oxide, Zirconium oxide, Niobium Oxide, Tantalum Oxide, Zinc Oxide, Tin Oxide, or Zinc Sulfide.

13. The OLED device of claim 11 wherein the high index particles are irregular in shape and have a maximum linear extent predominantly between 300 nm to about 2,000 nm.

14. The OLED device of claim 1 wherein the OLED device includes one or more serially connected segments.

15. The OLED device of claim 1 wherein the OLED device has a stacked structure.

* * * * *